United States Patent
Chen et al.

(10) Patent No.: US 10,393,808 B2
(45) Date of Patent: Aug. 27, 2019

(54) EYE PATTERN GENERATOR

(71) Applicant: Shanghai Zhaoxin Semiconductor Co., Ltd., Shanghai (CN)

(72) Inventors: Yang Chen, Shanghai (CN); Yongqi Zhou, Shanghai (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 16/014,183

(22) Filed: Jun. 21, 2018

(65) Prior Publication Data
US 2019/0128962 A1    May 2, 2019

(30) Foreign Application Priority Data
Oct. 31, 2017 (CN) .......................... 2017 1 1049386

(51) Int. Cl.
H04B 14/04 (2006.01)
G01R 31/3181 (2006.01)
G01R 31/317 (2006.01)

(52) U.S. Cl.
CPC . *G01R 31/31813* (2013.01); *G01R 31/31709* (2013.01); *G01R 31/31726* (2013.01); *G01R 31/31727* (2013.01)

(58) Field of Classification Search
CPC ........ G01R 31/31813; G01R 31/31727; G01R 31/31726; G01R 31/31709
See application file for complete search history.

(56) References Cited

U.S. PATENT DOCUMENTS

| 7,174,279 | B2 | 2/2007 | Conner |
| 9,148,235 | B1 | 9/2015 | Kang et al. |
| 9,378,843 | B1* | 6/2016 | Hossain ................... H03L 7/00 |
| 2018/0262373 | A1* | 9/2018 | Shibasaki ............. H04L 25/063 |

OTHER PUBLICATIONS

Chinese language office action dated Sep. 5, 2018, issued in application No. TW 106144157.

* cited by examiner

*Primary Examiner* — Dhaval V Patel
(74) *Attorney, Agent, or Firm* — McClure, Qualey & Rodack, LLP

(57) ABSTRACT

An eye pattern generator for generating an eye pattern of an input signal is provided. The eye pattern generator includes first and second comparators and a control circuit. The first comparator receives the input signal, a clock signal, and a first voltage and compares the input signal with the first voltage according to the clock signal to generate a first comparison signal. The second comparator receives the input signal, the clock signal, and a second voltage lower than the first voltage and compares the input signal with the second voltage according to the clock signal to generate a second comparison signal. The control circuit changes at least one of a level of the first voltage and a level of the second voltage according to the first and second comparison signals to form a region boundary between an open-eye region and a closed-eye region of the eye pattern.

11 Claims, 6 Drawing Sheets

EYE PATTERN GENERATOR

CROSS REFERENCE TO RELATED APPLICATIONS

This Application claims priority of Chinese Patent Application No. 201711049386.5, filed on Oct. 31, 2017, the entirety of which is incorporated by reference herein.

BACKGROUND OF THE INVENTION

Field of the Invention

The invention relates to an eye pattern generator that obtains information about an eye pattern through comparators operating according to the same clock signal.

Description of the Related Art

In electronic systems, especially in electronic systems used for high-speed communications, the eye patterns of digital signals indicate the system performance, wherein the system outputs the digital signals. The width, height, intersection and other information of an eye pattern are affected by intersymbol interference, signal attenuation, noise, and signal jitter of the digital signals, so system performance can be determined or analyzed by using the information about the eye pattern. In a typical eye pattern generator, several comparators operate based on the different clock signals which are used to perform respective sampling and comparison operations to an input signal, and the information of the eye pattern is generated according to the comparison results output by these comparators. Because these comparators operate based on different clock signals, a synchronization circuit is required to synchronize the comparison results generated by these comparators. However, the usage of a synchronization circuit may result in an insufficient timing margin, and reducing the stability and accuracy of the eye pattern.

BRIEF SUMMARY OF THE INVENTION

An exemplary embodiment of an eye pattern generator for generating an eye pattern of an input signal is provided. The eye pattern generator comprises a first comparator, a second comparator, and a control circuit. The first comparator receives the input signal, a first clock signal, and a first voltage and compares the input signal with the first voltage according to the first clock signal to generate a first comparison signal. The second comparator receives the input signal, the first clock signal, and a second voltage that is lower than the first voltage and compares the input signal with the second voltage according to the first clock signal to generate a second comparison signal. The control circuit receives the first comparison signal and the second comparison signal and changes at least one of a level of the first voltage and a level of the second voltage according to the first comparison signal and the second comparison signal to form a region boundary between an open-eye region and a closed-eye region of the eye pattern.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
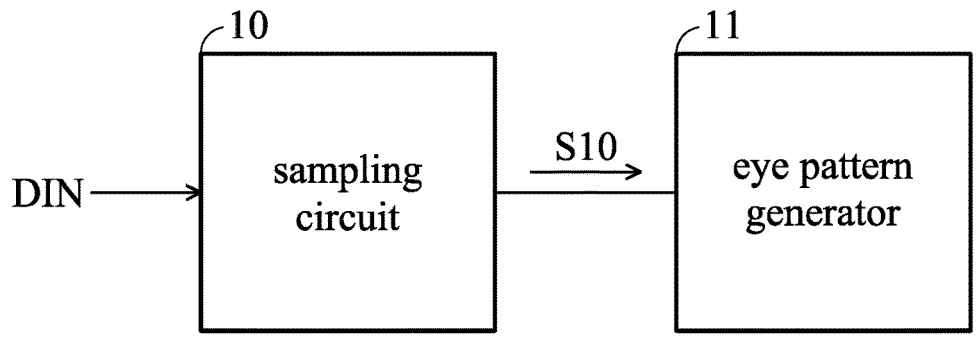
FIG. 1 shows an eye pattern generation device.
Figure 2:
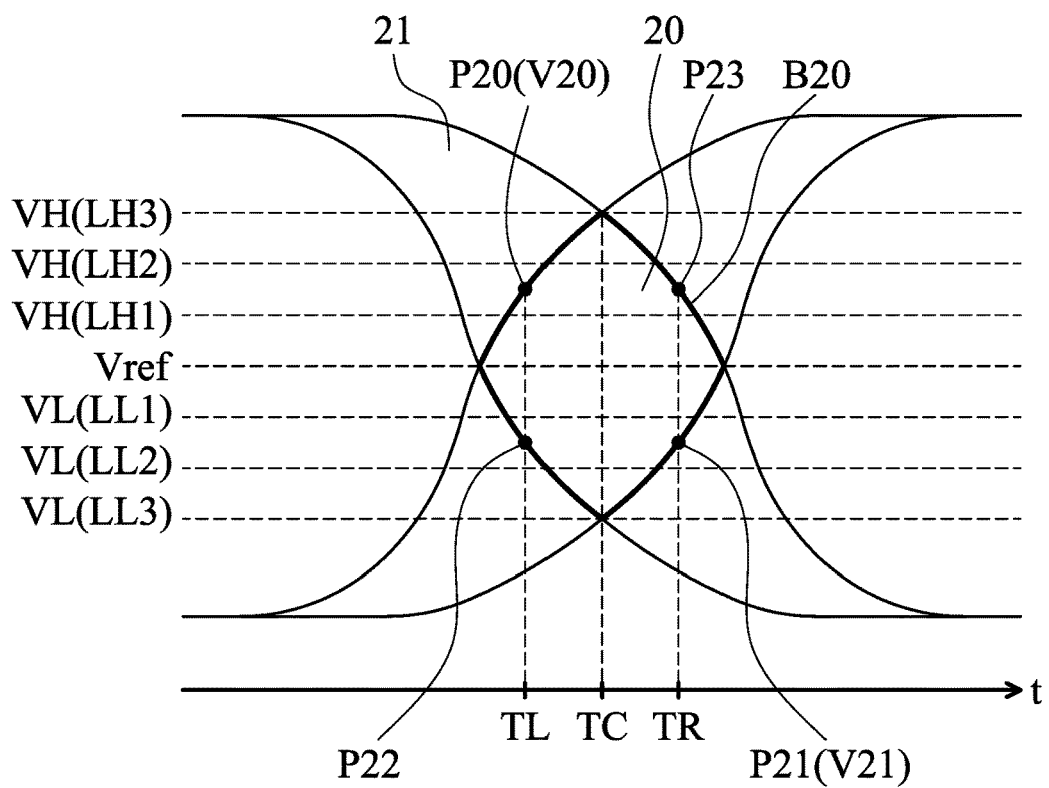
FIG. 2 shows an eye pattern according to an exemplary embodiment.

FIG. 1 shows an eye pattern generation device that can generate an eye pattern of a signal. The eye pattern generation device shown in FIG. 1 comprises a sampling circuit 10 and an eye pattern generator 11. The sampling circuit 10 receives an input signal DIN and samples the input signal according to a sampling rate of a specific frequency to generate a sampling signal S10. The sampling signal S10 comprises sampling point data. The eye pattern generator 11 may display the generated eye pattern with a display device (not shown), and may not display the generated eye pattern. The eye pattern generator 11 receives the sampling signal S10 and divides the sampling signal S10 into a plurality of data sections each having a predetermined time length. The eye pattern generator 11 may repeatedly superimpose the plurality of data sections described above to constitute an eye pattern. As shown in FIG. 2, a sampling point on the eye pattern corresponds to one sampling point datum of the sampling signal S10. Referring to FIG. 2, the eye pattern may be divided into an open-eye region 20 and a closed-eye region 21. The open-eye region 20 is an area surrounded by the sampling points P20, P23, P22, and P21. The close area 21 is an area excluding the open-eye area 20 in the eye pattern. The pattern information of the open-eye region 20, such as the height and width, reflects the performance of the electronic system, wherein the electronic system generates the input signal DIN.

Figure 3:
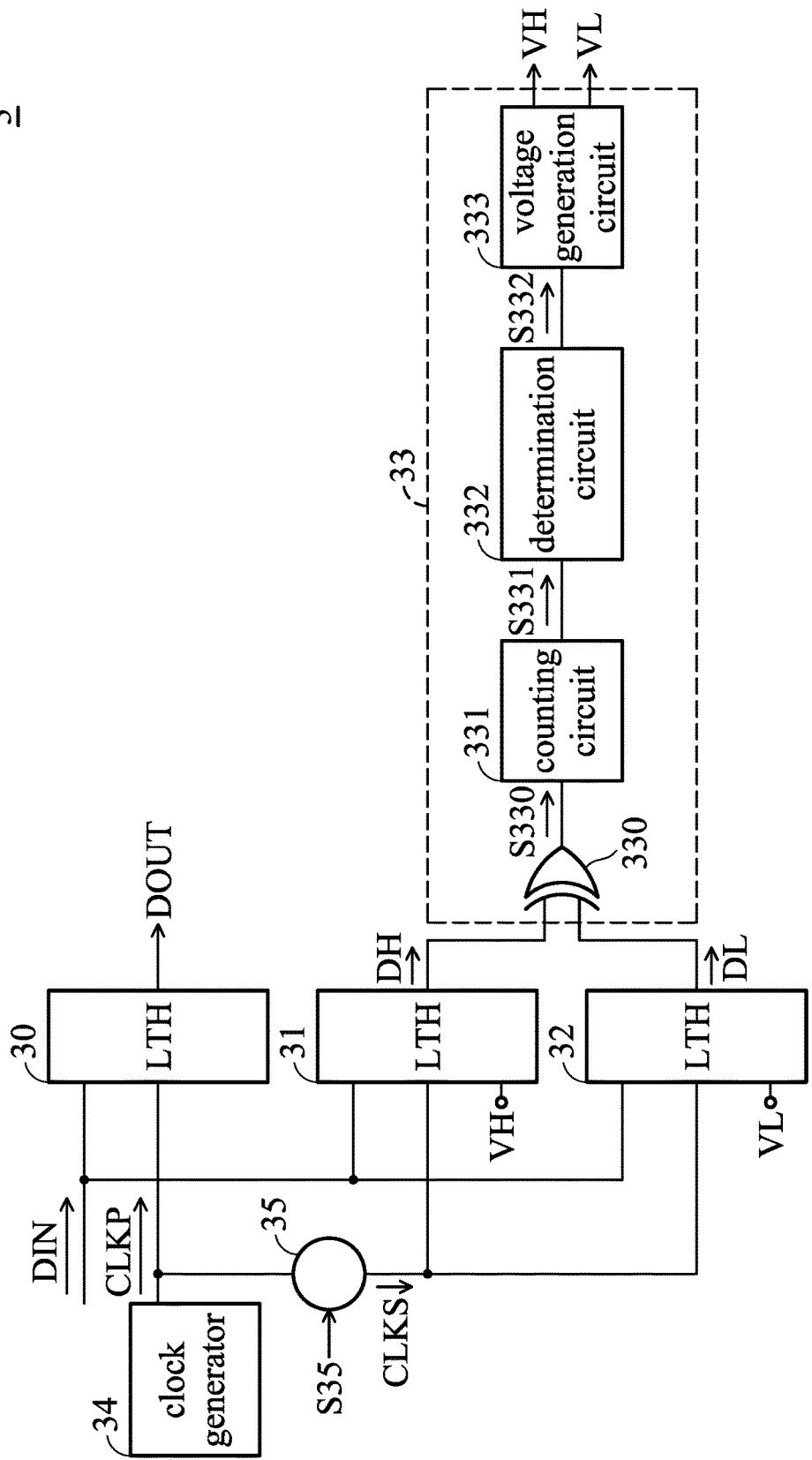
FIG. 3 shows one exemplary embodiment of an eye pattern generator.
Figure 4:
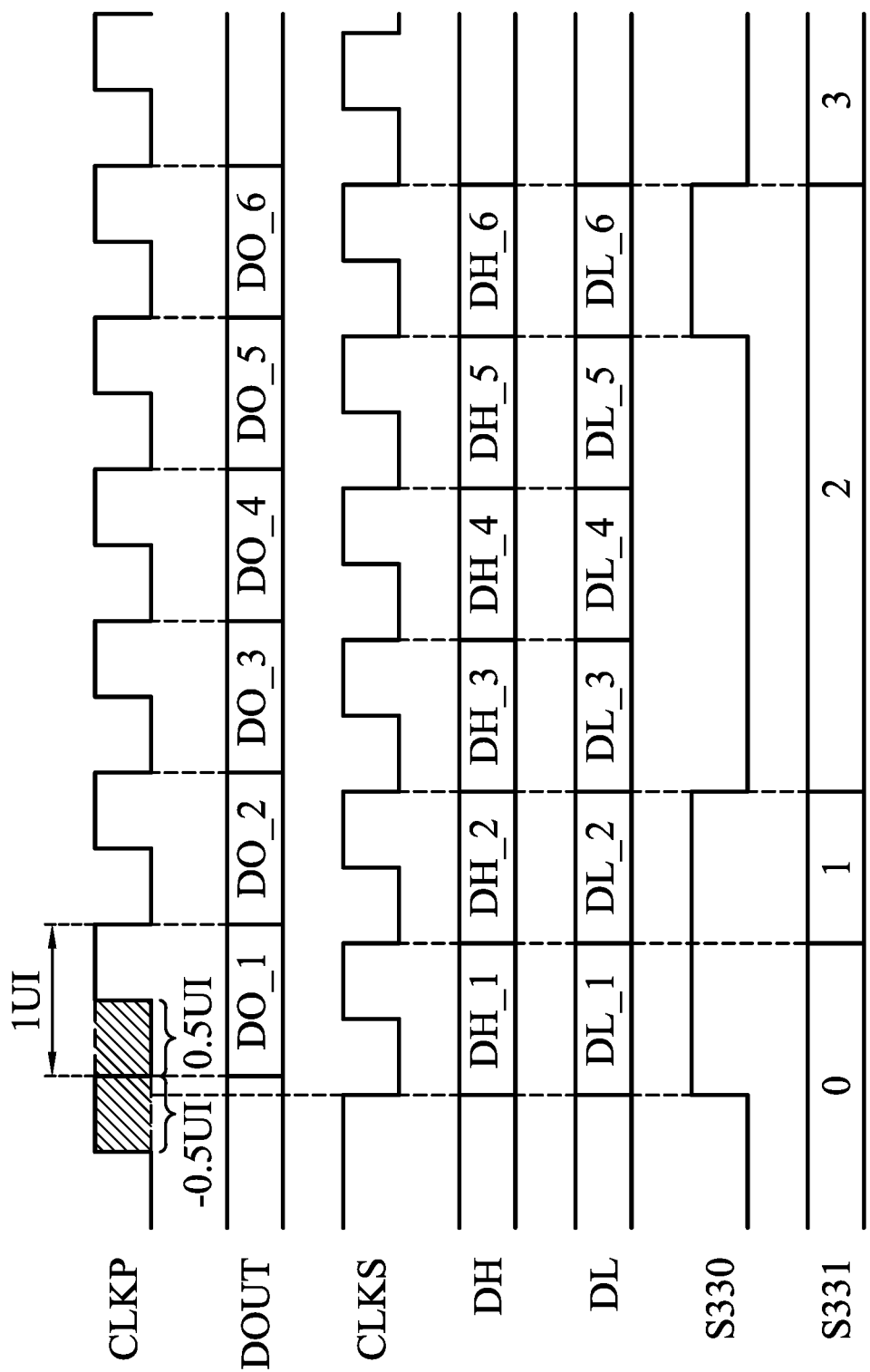
FIG. 4 is a timing chart of main signals of an eye pattern generator according to one exemplary embodiment.
Figure 5:
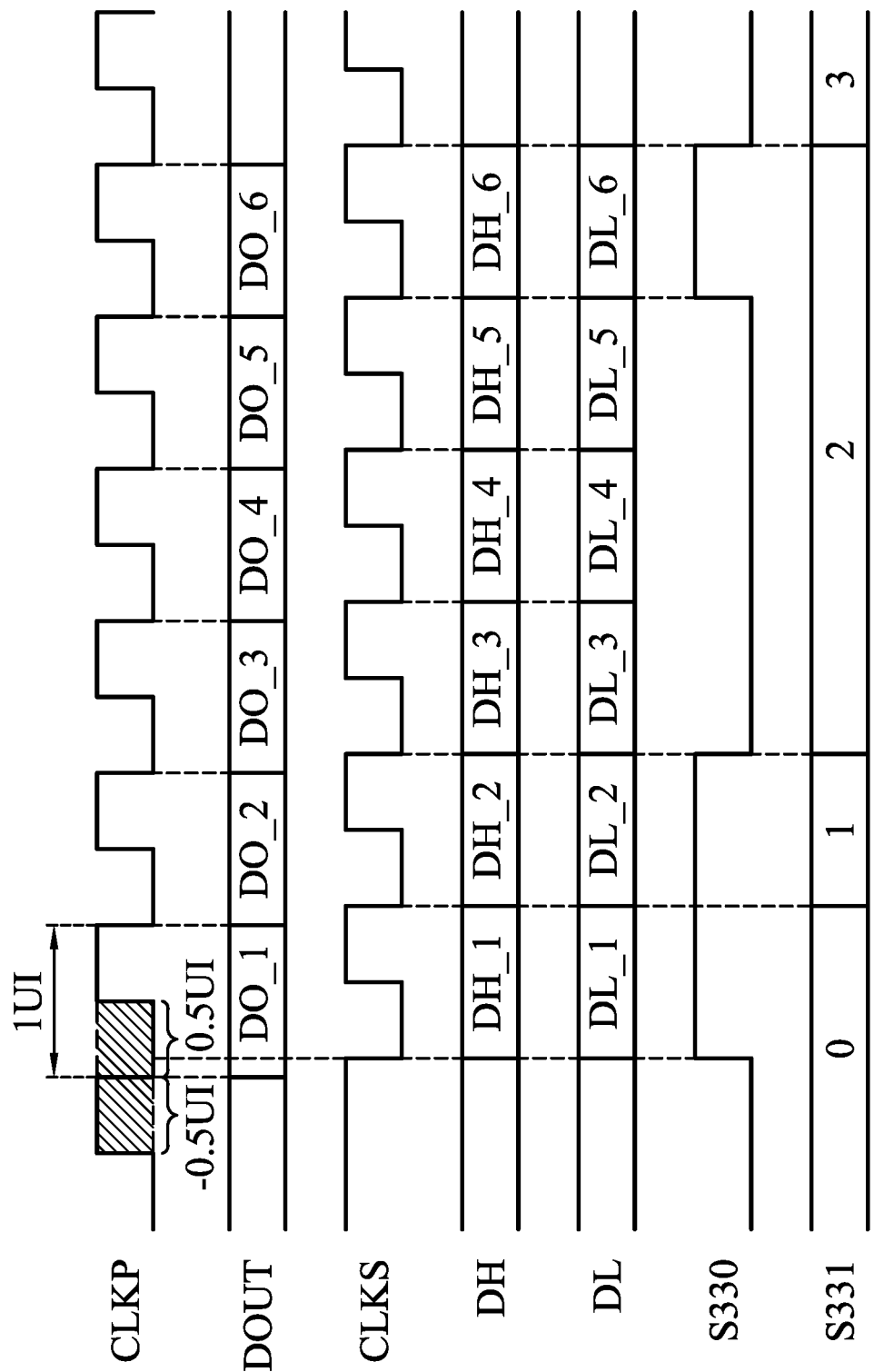
FIG. 5 is a timing chart of main signals of an eye pattern generator according to another exemplary embodiment.

FIG. 3 shows an exemplary embodiment of an eye pattern generator. The eye pattern generator 3 provided by the present invention can operate in a plurality of detection periods to analyze an input signal so as to obtain the region boundary B20 between the open-eye region 20 and the closed-eye region 21 of the eye pattern. Referring to FIG. 3, the eye pattern generator 3 comprises a control circuit 33, a clock generator 34, a regulator 35, and three comparators (LTH), namely comparators 30 to 32. The clock generator 34 generates a clock signal CLKP. The regulator 35 receives the clock signal CLKP from the clock generator 34 and generates a clock signal CLKS according to an adjustment signal S35. As shown in FIG. 4, an interval between two adjacent valid transitions of the clock signal CLKP may be represented by a unit interval (UI), that is, the nominal time difference between two adjacent falling edges or between two adjacent rising edges. According to an embodiment, there is a variable phase shift between the clock signal CLKS and the clock signal CLKP. The variable phase is varied in the range −0.5UI~+0.5UI and determined by the adjustment signal S35, as shown in the shaded part in FIG. 4. Here, "−" indicates that the clock signal CLKS is shifted leftward with respect to the clock signal CLKP, and "+" indicates that the clock signal CLKS is shifted rightward with respect to the clock signal CLKP. FIG. 4 shows an example that the clock signal CLKS is shifted leftward relative to the clock signal CLKP. FIG. 5 shows an example that the clock signal CLKS is shifted rightward relative to the clock signal CLKP.

As shown in FIG. 3, the comparator 30 receives the input signal DIN and the clock signal CLKP. The comparator 30 samples the input signal DIN according to the clock signal CLKP and compares each sampled value with a reference voltage Vref, wherein each sampled value is obtained through the sampling operation. The reference voltage may be generated by the comparator 30, or may be provided by an external circuit to the comparator. In the embodiment, as shown in FIG. 2, the reference voltage Vref is 0V. Referring to FIGS. 3-5, the comparator 30 takes each falling edge of the clock signal CLKP as a sampling edge and samples the input signal DIN at each falling edge of the clock signal CLKP. The comparator 30 compares the sampled values with the reference voltage Vref and generates the output signal DOUT according to the comparison results.

As shown in FIG. 3, the comparator 31 receives the input signal DIN, the clock signal CLKS, and a variable voltage VH. The comparator 31 samples the input signal DIN according to the clock signal CLKS to obtain sampled values, and compares each sampled value with the voltage VH. In the embodiment, the voltage VH is a voltage higher than the reference voltage Vref. Referring to FIGS. 3-5, the comparator 31 takes each falling edge of the clock signal CLKS as a sampling edge and samples the input signal DIN at each falling edge of the clock signal CLKS. Each time one sampled value is obtained, the comparator 31 compares the sampled value with the voltage VH and generates a comparison signal DH according to the comparison result. For further description, the comparison signal DH is divided into a plurality of sections by taking the falling edges of the clock signal CLKS as dividing lines. The signal states, high level or low level, of these sections of the comparison signal DH respectively indicate the comparison results, wherein the comparison results are generated by sampling the input signal DIN at the falling edges of the clock signal CLKS and performing the comparison operation. As shown in FIGS. 4 and 5, the comparison signal DH is divided into, for example, six sections, DH_1 to DH_6. When the comparator 31 determines that one sampled value is greater than the voltage VH, the comparison signal DH generated by the comparator 31 is at a high level in the corresponding section. Conversely, when the comparator 31 determines that one sampled value is less than the voltage VH, the comparison signal DH generated by the comparator 31 is at a low level in the corresponding section. The eye pattern in FIG. 2 shows an image of the superimposed sections of the input signal DIN, and each section of the input signal DIN presents at one unit interval UI. For example, in the embodiment of FIG. 4, the clock signal CLKS is shifted leftward with respect to the clock signal CLKP under the controlling of the adjustment signal S35, and each falling edge of the clock signal CLKS corresponds to a time point TL of the eye pattern in FIG. 2. In the embodiment of FIG. 5, the clock signal CLKS is shifted rightward with respect to the clock signal CLKP under the controlling of the adjustment signal S35, and each falling edge of the clock signal CLKS corresponds to a time point TR of the eye pattern in FIG. 2.

As shown in FIG. 3, the comparator 32 receives the input signal DIN, the clock signal CLKS, and a voltage VL. The comparator 32 samples the input signal DIN according to the clock signal CLKS to obtain sampled values and compares each sampled value with the voltage VL. In the embodiment, the voltage VL is a voltage that is lower than the reference voltage Vref. Referring to FIGS. 3-5, the comparator 32 takes each falling edge of the clock signal CLKS as a sampling edge and samples the input signal DIN at each falling edge of the clock signal CLKS. Every time obtained one sampled value, the comparator 32 compares the sampled value with the voltage VL and generates a comparison signal DL according to the comparison result. The comparison signal DL is divided into a plurality of sections by taking the falling edges of the clock signal CLKS as dividing lines. The signal states, which are high level or low level, of these sections of the comparison signal DL respectively indicate the comparison results, wherein the comparison results are generated by sampling the input signal DIN at the falling edges of the clock signal CLKS and performing the comparison operation. In FIGS. 4 and 5, for example, the comparison signal DL is divided into six sections DL_1 to DL_6. When the comparator 32 determines that one sampled value is greater than the voltage VL, the comparison signal DL generated by the comparator 32 is a high level in the corresponding section. Conversely, when the comparator 32 determines that one sampled value is less than the voltage VL, the comparison signal DL generated by the comparator 31 is a low level in the corresponding section.

According to another embodiment, each of the comparators shown in FIG. 3 performs only the respective comparison operation. In this case, the sampling operations for the input signal may be performed by other circuits, and then the sampled values are transmitted to the respective comparators shown in FIG. 3 to perform the above comparison operations.

As shown in FIG. 3, the control circuit 33 comprises an exclusive OR (XOR) gate 330, a counting circuit 331, a determination circuit 332, and a voltage generation circuit 333. The input terminals of the XOR gate 330 are coupled to the comparators 31 and 32 to receive the comparison signals DH and DL from the comparators 31 and 32, respectively, and the XOR gate 330 generates a logic output signal S330. The counting circuit 331 is coupled to the output terminal of the XOR gate 330 to receive the logic output signal S330, and the counting circuit 331 generates a counting value S331. The determination circuit 332 is coupled to the counting circuit 331 to receive the generated counting value S331, and the determination circuit 332 generates a determination signal S332. The voltage generation circuit 333 is coupled to the determination circuit 332 to receive the determination signal S332, wherein the voltage generation circuit 333 generates the voltages VH and VL, and controls the voltages VH and VL according to the determination signal S332.

During a detection period, the comparator 31 and the comparator 32 repeatedly perform the above sampling and comparison operations and output the comparison signals DH and DL. The control circuit 33 performs a detection operation according to the comparison signals DH and DL generated by the comparators 31 and 32. As shown in FIG. 3, the XOR gate 330 receives the comparison signals DH and DL and generates the logic output signal S330 according to the comparison signals DH and DL. According to the logic operation of the XOR gate 330, the logic output signal S330 is at a high level when the comparison signals DH and DL are at different levels respectively. In the embodiment, depending on the relationship between the levels of the voltages VH and VL, the logic output signal S330 is a high level only when the corresponding sampled value is greater than the voltage VL and less than the voltage VH. According to the above description, the comparators 31 and 32 perform the respective comparison operations according to the clock signal CLKS. The counting circuit 331 receives the logic output signal S330. Every time received the logic output signal S330 with a high-level logic, the counting circuit 331 performs a counting operation to increase the counting value S331 by one. Thus, the counting circuit 331 performs the counting operation to calculate the number of data sections of the logic output signal S330 to generate the counting value S331, wherein the data sections of the logic output signal S330 are high level, and the logic output signal S330 is generated according to the respective comparison operations of the comparators 31 and 32. Therefore, the counting value S331 represents the accumulated number of sampled values, wherein the sampled values are greater than the voltage VL and less than the voltage VH among the plurality of sampled values obtained by sampling the input signal DIN for a predetermined number of times. For example, referring to FIG. 4 and FIG. 5, when the section DH_1 of the comparison signal DH and the corresponding section DL_1 of the comparison signal DL are at different levels, the corresponding data section of the logic output signal S330 is at high level, and the counting value S331 of the counting circuit 331 is increased by one, for example, from 1000 to 1001.

As shown in FIG. 3, during a detection period, the determination circuit 332 receives the counting value S331 and outputs the determination signal S332. The determination circuit 332 has a timer for determining a fixed time period much longer than the period of the clock signal CLKS for the determination circuit 332, wherein the timer may be a built-in timer or an external timer. For example, if the period of the clock signal CLKS is 0.25 ns, the fixed time period may be set to 1 s. The determination circuit 332 determines whether the counting value S331 is greater than a threshold during the fixed time period. The threshold may be any natural number, for example, 10000. The determination circuit 332 outputs the determination signal S332 according to the determination result. For further description, the determination signal S332 can be a first determination signal or a second determination signal according to the determination result. If the counting value S331 is greater than the threshold during the fixed time period, the determination circuit 332 outputs the first determination signal to control the voltage generation circuit 333 to decrease the current voltage VH and/or increase the current voltage VL. Inversely, if the counting value S331 is not greater than the threshold within the fixed time period, for example, if the counting value S331 keeps equal to zero, the determination circuit 332 outputs the second determination signal to control the voltage generation circuit 333 to increase the voltage VH and/or decrease the voltage VL. The directions of the changing of the voltage VH and the voltage VL are determined according to whether the determination signal S332 output by the determination circuit is the first determination signal or the second determination signal. If the determination signal S332 output by the determination circuit 332 is another signal, neither the first determination signal nor the second determination signal, that can't affect the voltage VH or the voltage VL. The output generated by the determination circuit 332 may be data having multiple bits. For example, the first determination signal is "01", and the second determination signal is "10". The output generated by the determination circuit 332 may also be data having one bit. For example, the first determination signal is "0" and the second determination signal is "1". The first determination signal is preset to be different from the second determination signal, either the first determination signal or the second determination signal may be used to reset the counting circuit 331, so that the counting circuit 331 may continue to count in the next detection period. In other embodiments, the signal used to reset the counting circuit 331 is not limited to a signal provided by the determination circuit 332, the signal may be provided by other circuits.

As shown in FIG. 3, in a detection period, the voltage generation circuit 333 receives the determination signal S332 and changes the level of at least one of the voltages VH and VL according to the determination signal S332. For example, the voltage generation circuit 333 changes the amplitude of the voltages VH and VL by a synchronized length or a non-synchronized length or only changing the amplitude of the voltage VH or VL. According to an embodiment, the voltages VH and VL are two symmetrical voltages with respect to the reference voltage Vref. In other words, the reference voltage Vref is lower than the voltage VH and higher than the voltage VL, and the absolute value of the difference between the voltage VH and the reference voltage Vref is equal to the absolute value of the difference between the voltage VL and the reference voltage Vref. For example, when the voltage Vref is equal to 0V (Vref=0V), voltages VH and VL are a pair of differential voltages. The voltage generation circuit 332 changes voltages VH and VL at the same time to different directions. More specifically, the voltage generation circuit 332 increases the voltage VH and decreases the voltage VL synchronously, or decreases the voltage VH and increases the voltage VL synchronously. Just as shown in FIG. 2, the voltage generation circuit 332 adjusts the voltage VH upward and adjusts the voltage VL downward synchronously, or adjusts the voltage VH downward and adjusts the voltage VL upward synchronously. In addition, the step used by the voltage generation circuit 332 to change the voltage VH is equal to the step used by the voltage generation circuit 32 to change the voltage VL.

In the following paragraphs, the operation of the eye pattern generator 3 described in detail using the voltages VH and VL that are symmetrical to the reference voltage Vref as an example.

Referring to FIG. 2 to FIG. 4, in a first detection period, the regulator 35 controls the clock signal CLKS to shift leftward with respect to the clock signal CLKP. Each falling edge of the clock signal CLKS corresponds to the time point TL of the eye pattern in FIG. 2. It is assumed that in the detection period, the voltage VH is initially at the level LH1 and the voltage VL is initially at the level LL1. In the following description, the levels will be marked in parentheses after the voltages VH and VL to indicate the changing in the levels of the voltages VH and VL. The absolute value of the difference between the voltage VH (LH1) and the reference voltage Vref is equal to the absolute value of the difference between the voltage VL (LL1) and the reference voltage Vref. The comparators 31 and 32 sample the input signal DIN by a predetermined number of times to obtain a plurality of sampled values and perform the respective comparison operations. The comparator 31 compares each sampled value with the voltage VH (LH1), and the comparator 32 compares each sampled value with the voltage VL (LL1). For example, the comparators 31 and 32 sample the input signal DIN at a falling edge of the clock signal CLKS to obtain the sampling point P20 shown in FIG. 2. The voltage value of the sampling point P20 is V20. To describe conveniently, the voltage value of the sampling point P20 is referred to as sampled value V20 in the following. The comparator 31 performs the respective comparison operation to compare the sampled value V20 with the voltage VH (LH1) and determines that the sampled value V20 is greater than the voltage VH (LH1). The comparator 32 performs the respective comparison operation to compare the sampled value V20 with the voltage VL (LL1) and determines that the sampled value V20 is greater than the voltage VL (LL1). At this time, the comparator 31 generates the comparison signal DH with a high level, and the comparator 32 generates the comparison signal DL with a high level. The XOR gate 330 outputs the signal S330 with a low level, and the counting value S331 of the counter circuit 331 maintains the original value, that is, the counting value S331 is not increased by one. After the comparators 31 and 32 have completed the comparison operations for the sampled values, when the determination circuit 332 with a timer determines that the counting value S331 obtained within a fixed time period is not greater than a threshold, the determination signal S332 is changed at the end of the fixed time period. The counting value S331 represents the accumulated number of sampled values that are greater than the voltage VL and less than the voltage VH among the plurality of sampled values obtained by sampling the input signal DIN for the predetermined number of times, and then, the voltage generation circuit 333 increases voltage VH and decreases voltage VL synchronously. For example, the determination signal S332 changes from "00" to the second determination signal "10" to control the voltage generation circuit 333 to increase the voltage VH from the level LH1 to the level LH2 and decrease the voltage VL from level LL1 to level LL2, synchronously. At this time, the step used by the voltage generation circuit 333 to increase the voltage VH is equal to the step used by the voltage generation circuit 333 to decrease the voltage VL. According to another embodiment, the step which is used by the voltage generation circuit 333 to increase the voltage VH may not be equal to the step which is used by the voltage generation circuit 333 to decrease the voltage VL. When the sampled value V20 is synchronously greater than the voltage VH and greater than the voltage VL, or synchronously less than the voltage VH and less than the voltage VL, the counting value S331 obtained by the determination circuit 332 within the fixed time period will not be greater than the threshold, or even be zero. The determination circuit 332 outputs a second determination signal at the end of the fixed time period, such as "10". The second determination signal which is used to control the voltage generation circuit 333 to increase the voltage VH, such as from level LH1 to level LH2, and to decrease the voltage VL, such as from LL1 to LL2 synchronously, and to further control the counting circuit 331 to reset the counting value S331 to zero. Then, after the voltage VH is increased to the level LH2 and the voltage VL is decreased to level LL2, the output of the determination circuit 332 is reset.

As shown in FIG. 2, next, in a second detection period, the comparator 31 and the comparator 32 perform comparison operations respectively according to the changed voltages VH (LH2) and VL (LL2), and the counting circuit 331 restarts counting. The determination circuit 332 performs the determination operation to generate a corresponding determination signal S332, and the determination signal S332 controls the voltage generator 330 continuously to change the voltages VH and VL. In the first detection period, the control circuit 33 changes the voltage VH from the level LH1 to the level LH2 and changes the voltage VL from the level LL1 to the level LL2 at the end of the fixed time period. Then, the eye pattern generator enters the second detection period. In the second detection period, the determination circuit 332 determines that the obtained counting value S331 is greater than the threshold during the fixed time period, and the output determination signal S332 output by the determination circuit 332 is the first determination signal.

The determination signal S332 output by the determination circuit 332 is the second determination signal in the first detection period and the first determination signal in the second detection period. In other words, the determination signal S332 output by the determination circuit 332 in one of two successive detection periods is different from the determination signal S332 output by the determination circuit 332 in the other of the two successive detection periods. As the voltage VH/VL increases/decreases, the sampling point P20 moves from a position outside the range between voltages VH and VL to a position in the range between the voltages VH and VL. At this time, a lower one is determined: the level of the voltage VH of the comparator 31 in the first detection period, or the level of the voltage VH of the comparator 31 in the second detection period. Of the voltage VH at the current level LH2 and the voltage VH at the previous level LH1, the lower one serves as an upper boundary voltage on the region boundary. In this way, the upper boundary voltage corresponding to the voltage VH at the level LH1 at time point TL can be described as the upper boundary point on the region boundary B20. Moreover, a higher one is determined: the level of the voltage VL of the comparator 32 in the first detection period or the level of the voltage VL of the comparator 32 in the second detection period. Of the voltage VL at the current level LL2 and the voltage VL at the previous level LL1, the higher one serves as a lower boundary voltage on the region boundary. In this way, the lower boundary voltage corresponding to the voltage VL at the level LL1 at time point TL can be described as the lower boundary point on the region boundary B20.

After obtaining the boundary points corresponding to the time point TL, the regulator 35 changes the phase that the clock signal CLKS shifts to allow the eye pattern generator 3 to obtain the boundary points corresponding to another time point. The comparators 31 and 32 and the control circuit 33 continue to perform the aforementioned operations, to change the voltages VH and VL until the determination signal generated by the determination circuit in one of two successive detection periods is different from the determination signal generated by the determination circuit in the other of the two successive detection periods, thereby obtaining new boundary points for the region boundary B20. The aforementioned operations perform continuously to describe the entire region boundary B20.

Referring to FIGS. 2, 3, and 5, in a third detection period, the regulator 35 controls the clock signal CLKS to shift rightward with respect to the clock signal CLKP. Each falling edge of the clock signal CLKS corresponds to the time point TR shown in FIG. 2. It is assumed that in the detection period, the voltage VH is initially at the level LH3 and the voltage VL is initially at the level LL3. The absolute value of the difference between the voltage VH (LH3) and the reference voltage Vref is equal to the absolute value of the difference between the voltage VL (LL3) and the reference voltage Vref. The comparators 31 and 32 perform the respective sampling operations to sample the input signal DIN by the predetermined number of times and obtain a plurality of sampled values. The comparator 31 compares each sampled value with the voltage VH (LH3), and the comparator 32 compares each sampled value with the voltage VL (LL3). The comparators 31 and 32 sample the input signal DIN at a falling edge of the clock signal CLKS to obtain the sampling point P21 shown in FIG. 2. The sampled value corresponding to the sampling point P21 is V21. The comparator 31 performs the respective comparison operation to compare the sampled value V21 with the voltage VH (LH3) and determines that the sampled value V21 is less than the voltage VH (LH3). The comparator 32 performs the respective comparison operation to compare the sampled value V21 with the voltage VL (LL3) and determines that the sampled value V21 is greater than the voltage VL (LL3). At this time, the comparator 31 generates the comparison signal DH with a low level, and the comparator 32 generates the comparison signal DL with a high level. The corresponding data section of the output logic signal S330 generated by the XOR gate 330 is at a high level, and the counting value S331 of the counter circuit 331 is increased from the original value, so that the counting value S331 generated by the determination circuit 332 (the counting value S331 represents the accumulated number of sampled values, the sampled values are greater than the voltage VL and less than the voltage VH among the plurality of sampled values obtained by sampling the input signal DIN by the predetermined number of times) becomes greater than the threshold within the fixed time period. At this time, the determination signal S332 output by the determination circuit 332 is a first determination signal such as "01". The voltage generation circuit 333 decreases the voltage VH from the level LH3 to the level LH2 and increases the voltage VL from LL3 to the level LL2 synchronously. The step used by the voltage generation circuit 333 to decrease the voltage VH is equal to the step used by the voltage generation circuit 333 to increase the voltage VL. According to another embodiment, the step used by the voltage generation circuit 333 to decrease the voltage VH may not be equal to the step used by the voltage generation circuit 333 to increase the voltage VL. When the sampled value V21 is less than the voltage VH and greater than the voltage VL, the counting value S331 obtained by the determination circuit 332 during the fixed time period is increased continuously during the fixed time period. When the accumulated counting value S331 is greater than the threshold, the generated determination signal S332 is the first determination signal to control the voltage generation circuit 333 to decrease the voltage VH and to increase the voltage VL synchronously, and further control the counting circuit 331 to reset the counting value S331 to zero. Then, after the voltage VH is decreased and the voltage VL is increased, the output of the determination circuit 332 is reset.

In a fourth detection period, the comparator 31 and the comparator 32 perform respective comparison operations on one sampled value V21 according to the changed voltages VH (LH2) and VL (LL2), and the counting circuit 331 restarts counting. The determination circuit 332 performs the determination operation to generate the corresponding determination signal S332 to control the voltage generator 330 to change the voltages VH and VL. In the third detection period, the accumulated counting value S331 obtained by the control circuit 33 during the fixed time period is increased to be greater than the threshold, so that the control circuit 33 changes the voltage VH from the level LH3 to the level LH2 and changes the voltage VL from the level LL3 to the level LL2. Then, the eye pattern generator 3 enters the fourth detection period. In the fourth detection period, the determination circuit 332 determines that the counting value S331 obtained during the fixed time period is still greater than the threshold. Then the determination circuit 332 outputs a first determination signal, such as "01", to control the voltage generation circuit 333, to decrease the voltage VH from the level LH2 to the level LH1 and increase the voltage VL from the level LL2 to the level LL1. Further, the first determination signal is applied to control the counting circuit 331 to reset the counting value S331 to zero. Then, after the voltage VH is decreased to the level LH1 and the voltage VL is increased to the level LL1, the output of the determination circuit 332 is reset, for example, from "01" to "00".

In a fifth detection period, the comparator 31 and the comparator 32 perform respective comparison operations on one sampled value V21 according to the changed voltages VH (LH1) and VL (LL1), and the counting circuit 331 restarts counting. The determination circuit 332 performs the determination operation to generate the corresponding determination signal S332 to control the voltage generator 330 to change the voltages VH and VL. Referring to FIG. 2, when the voltage VH is at the level LH1 and the voltage VL is at the level LL1, if the determination circuit 332 determines that the accumulated counting value S331 obtained during the fixed time period is not greater than the threshold, the determination circuit 332 output a second determination signal, such as "10". The second determination signal is used to increase the voltage VH and decrease the voltage VL, and further, to reset the counting circuit 331. Then, after the voltage VH is increased and the voltage VL is decreased, the output of the determination circuit 332 is reset, for example, from "10" to "00".

The determination signal S332 output by the determination circuit 332 is respectively the first determination signal and the second determination signal in the fourth detection period and the fifth detection period. In other words, the determination signal S332 output by the determination circuit 332 in one of two successive detection periods is different from the determination signal S332 output by the determination circuit 332 in the other of the two successive detection periods. As the voltage VH/VL decreases/increases, the sampling point P21 moves from a position in the range between the voltages VH and VL to a position outside the range between the voltages VH and VL. At this time, a lower one is determined: the current level LH1 of the voltage VH or the previous level LH2 of the voltage VH (that is, lower one of the levels during the last two times that the comparator 31 performed the comparison operation), and the lower one serves as an upper boundary voltage on the region boundary. In this way, the upper boundary voltage (the voltage VH at the level LH1) at the time point TR can be described as the upper boundary point on the region boundary B20. Moreover, a higher one is determined: the current level LL1 of the voltage VL or the previous level LL2 of the voltage VL is higher (that is, higher one of the levels during the last two times that the comparator 31 performed the comparison operation), and the higher one serves as the lower boundary voltage on the region boundary. In this way, the lower boundary voltage (the voltage VL at the level LL1) at the time point TR can be described as the lower boundary point on the region boundary B20. After the boundary points corresponding to the time point TR are obtained, the regulator 35 changes the amount that clock signal CLKS shifts relative to the clock signal CLKP, and the eye pattern generator 3 enters the following detection period to continuously obtain other boundary points of the region boundary B20, thereby depicting the entire region boundary B20.

The above embodiments are based on cases where the voltages VH and VL are symmetrical to the reference voltage Vref and the voltages VH and VL are changed simultaneously based on the reference voltage Vref. In other embodiments, the voltage generator 333 may change the voltage VL first and then the voltage VH, or change the voltage VH first and then the voltage VL. The related operations are similar to those described above. According to another embodiment, the reference voltage Vref is less than the voltage VH and greater than the voltage VL, and the absolute value of the difference between the voltage VH and the reference voltage Vref may not always be equal to the absolute value of the difference between the voltage VL and the reference voltage Vref. For example, the voltage generating circuit 332 changes the voltages VH and VL asynchronously or the voltage generating circuit 332 varies the voltages VH and VL synchronously but the steps taken when changing the voltages VH and VL are different or the initial levels of the voltages VH and VL are different.

According to an embodiment of the present invention, when the determination circuit performs the determination operation, the determination circuit obtains the counting value S331 according to the magnitude of the sampled values with respect to the voltages VH and VL, wherein the sampled values are obtained by sampling the input signal by a predetermined number of times. That is, the determination circuit obtains the counting value S331 according to the positions of the sampled points shown in FIG. 2 with respect to the voltages VH and VL. Moreover, the directions of the changing of the voltages VH and VL are determined by whether the counting value S331 is greater than a threshold within a fixed time period. When a sampled point is between the voltages VH and VL, the counting value S331 will be accumulated to a value greater than the threshold during the fixed time period. At this time, the voltage VH is decreased, and the voltage VL is increased until the counting value S331 is not greater than the threshold at the end of the fixed time period of a certain detection period. Then, the voltages VH and VL in the certain detection period are compared with the voltages VH and VL in the previous detection period respectively. The lower voltage VH and the higher voltage VL serve as boundary voltages to avoid jitter on the input signal DIN affecting the accuracy of the detection of the region boundary B20. When a sampled point is at a position outside of the range (the range is between voltage VH and voltage VL), that is, when a sampled value is greater than the voltages VH and VL simultaneously or less than the voltages VH and VL simultaneously, the counting value S331 is not greater than the threshold within the fixed time period. At this time, the voltage VH is increased and the voltage VL is decreased until the counting value S331 is accumulated to a value greater than the threshold during the fixed time period of a certain detection period. Then, the voltages VH and VL in the certain detection period are compared with the voltages VH and VL in the previous detection period, respectively. The lower voltage VH and the higher voltage VL serve as boundary voltages to avoid jitter on the input signal DIN affecting the accuracy of the detection of the region boundary B20.

According to the embodiment, the eye pattern generator 3 uses the regulator 35 to change the amount that the clock signal CLKS shifts relative to the clock signal CLKP. The time points corresponding to the falling edges of the clock signal CLKS are gradually changed from the left side of the time axis to the right side of the time axis. In this way, the aforementioned operations are performed repeatedly to obtain a plurality of boundary points to depict the region boundary B20. The eye width, eye height, intersection and other information about the eye pattern will be obtained according to the region boundary B20.

Figure 6:
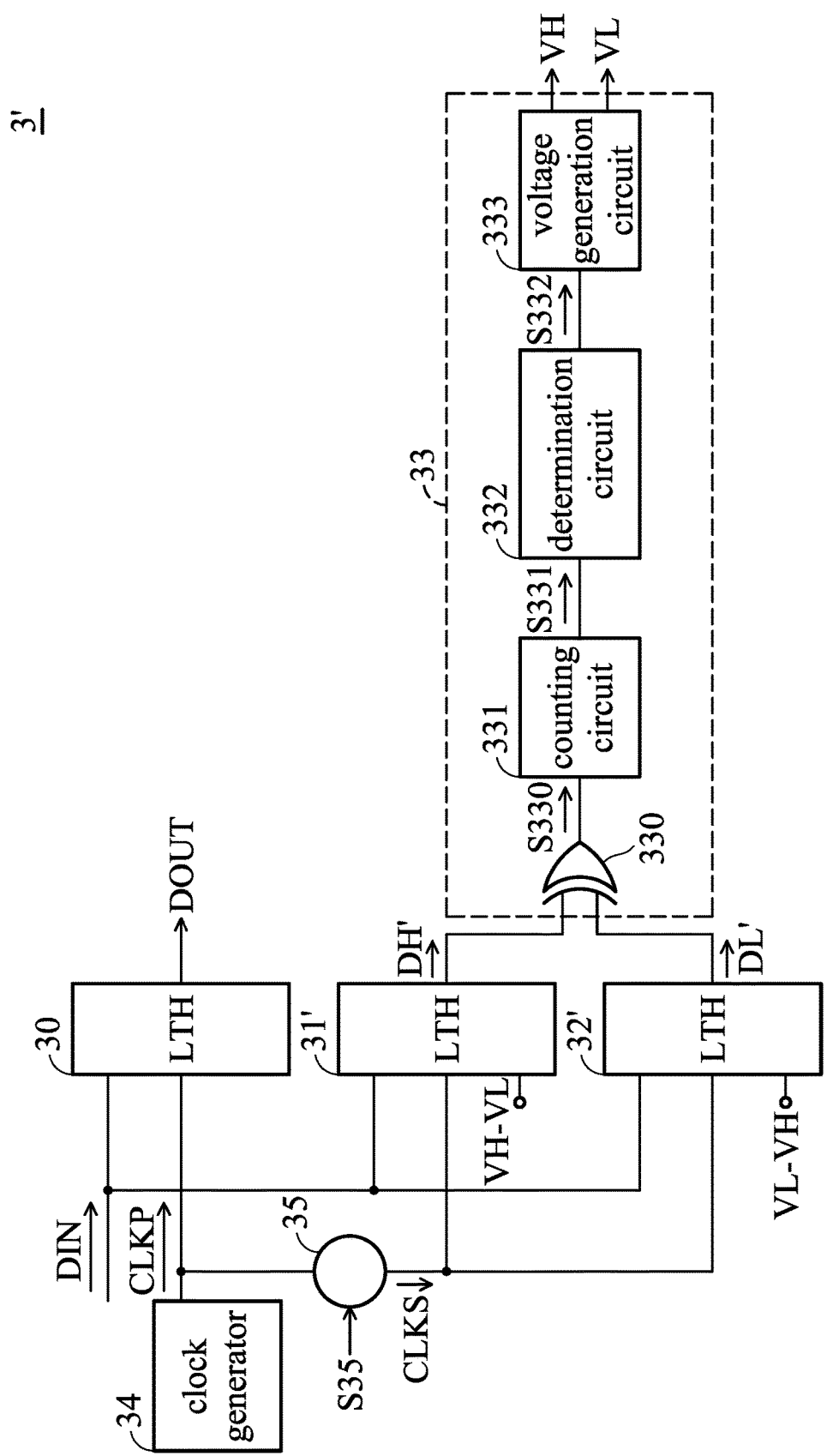
FIG. 6 shows another exemplary embodiment of an eye pattern generator.

FIG. 6 shows another exemplary embodiment of an eye pattern generator. The eye pattern generator 3' shown in FIG. 6 can operate in a plurality of detection periods to analyze an eye pattern so as to obtain the region boundary B20 between the open-eye region 20 and the closed-eye region 21 of the eye pattern. Referring to FIG. 6, the eye pattern generator 3' is substantially the same as the eye pattern generator 3 shown in FIG. 3, and the circuits or elements having the same symbol in the eye pattern generators 3 and 3' perform the same operations. The difference between eye pattern generators 3 and 3' is the voltage received by the comparators 31' and 32' of the eye pattern generator 3'. As shown in FIG. 6, the comparator 31' receives the voltage VH−VL, which is the difference of a voltage VH and a voltage VL, and the comparator 32' receives the voltage VL−VH, which is the difference of the voltage VL and the voltage VH. In addition, both of the comparators 31' and 32' receive the input signal DIN and the clock signal CLKS. The comparators 31' and 32' perform respective comparison operations. In the embodiment, the input signal DIN is a differential signal. When the comparison operations are performed, the comparators 31' and 32' sample the input signal DIN by a predetermined number of times according to the clock signal CLKS to obtain a plurality of sampled values. Each sampled value comprises voltages VIP and VIN.

During the period in which the comparator 31' performs the respective comparison operation, when the comparator 31' samples the input signal DIN according to a falling edge of the clock signal CLKS, the corresponding two voltages VIP and VIN are obtained. The comparator 31' compares the voltage difference VIP−VIN with the voltage VH−VL and generates a comparison signal DH' according to the comparison result. As shown in FIG. 2, in the embodiment, the voltage VH is a voltage higher than the reference voltage Vref, and the voltage VL is a voltage that is lower than the reference voltage Vref. When the comparator 31' determines that the voltage difference VIP−VIN is greater than the voltage VH−VL, the comparison signal DH' generated by the comparator 31' has a high level. On the other hand, when the comparator 31' determines that the voltage difference VIP−VIN is less than the voltage VH−VL, the comparison signal DH' generated by the comparator 31' has a low level.

During the period in which the comparator 32' performs the respective comparison operation, when the comparator 32' samples the input signal DIN according to a falling edge of the clock signal CLKS, the corresponding two voltages VIP and VIN are obtained. The comparator 32' compares the voltage difference VIP−VIN with the voltage VL−VH and generates a comparison signal DL' according to the comparison result. When the comparator 32' determines that the voltage difference VIP−VIN is greater than the voltage VL−VH, the comparison signal DL' generated by the comparator 32' has a high level. On the other hand, when the comparator 32' determines that the voltage difference VIP−VIN is less than the voltage VL−VH, the comparison signal DL' generated by the comparator 32' has a low level.

According to the above description, the voltage VH is higher than the reference voltage Vref, and the voltage VL is lower than the reference voltage Vref. Therefore, when the comparator 31' determines that the voltage difference VIP−VIN is greater than the voltage VH−VL, the comparator 32' also determines that the voltage difference VIP−VIN is greater than the voltage VL−VH. And when the comparator 32' determines that the voltage difference VIP−VIN is less than the voltage VL−VH, the comparator 31' also determines that the voltage difference VIP−VIN is less than the voltage VH−VL. The above two cases show that at the corresponding falling edge of the clock signal CLKS, the voltages VH and VL are located in the closed-eye region 21. When the comparator 31' determines that the voltage difference VIP−VIN is less than the voltage VH−VL and the comparator 32' determines that the voltage difference VIP−VIN is greater than the voltage VL−VH, it indicates that at the corresponding falling edge of the clock signal CLKS, the voltages VH and VL are located in the open-eye region 20. The XOR gate 330 receives the comparison signals DH' and DL' and generates the logic output signal S330 according to the comparison signals DH' and DL'. According to the logic operation of the XOR gate 330, the logic output signal S330 is at a high level when the comparison signals DH' and DL' are at different voltage levels respectively. In the embodiment, the logic output signal S330 is at the high level only when the voltage difference VIP−VIN is less than the voltage VH−VL and the voltage difference VIP−VIN is greater than the voltage VL−VH. The circuits following the XOR gate 330 comprises the counting circuit 330, the determination circuit 332, and the voltage generation circuit 333. The determination circuit 332 and the voltage generation circuit 333 operate according to the logic output signal S330. For the description related to the operations of the determination circuit 332 and the voltage generation circuit 333, please refer to the description of the embodiment in FIG. 3, and the related description is omitted herein.

The eye pattern generator provided in the embodiments may be used in a high-speed serial data transmission circuit with a specification, such as PCIE (Peripheral Component Interconnect Express), SATA (Serial Advanced Technology Attachment), USB (Universal Serial Bus), DP (Display port), or SD4 (Secure Digital 4), for example, a clock recovery circuit.

In the eye pattern generator provided in the embodiments, the comparators 31 and 32 sample and compare the input signal DIN with the same clock signal CLKS. Therefore, before the comparison signals DH and DL are transmitted to the control circuit 33, it is unnecessary to perform timing synchronization, which effectively avoids the problem of insufficient timing margin caused by the time-domain synchronization. In a traditional eye pattern generator, different clock signals are used for multiple comparators to perform sampling operations and comparison operates on an input signal to further obtain eye pattern information. However, since these comparators operate on different clock signals, a synchronization circuit, such as a flip-flop circuit, must be used to unify the results of the comparators into the same time domain, which increases the design area and design difficulty. The addition of the synchronization circuit may result in a lack of timing margin for subsequent processes.

Figure 7:
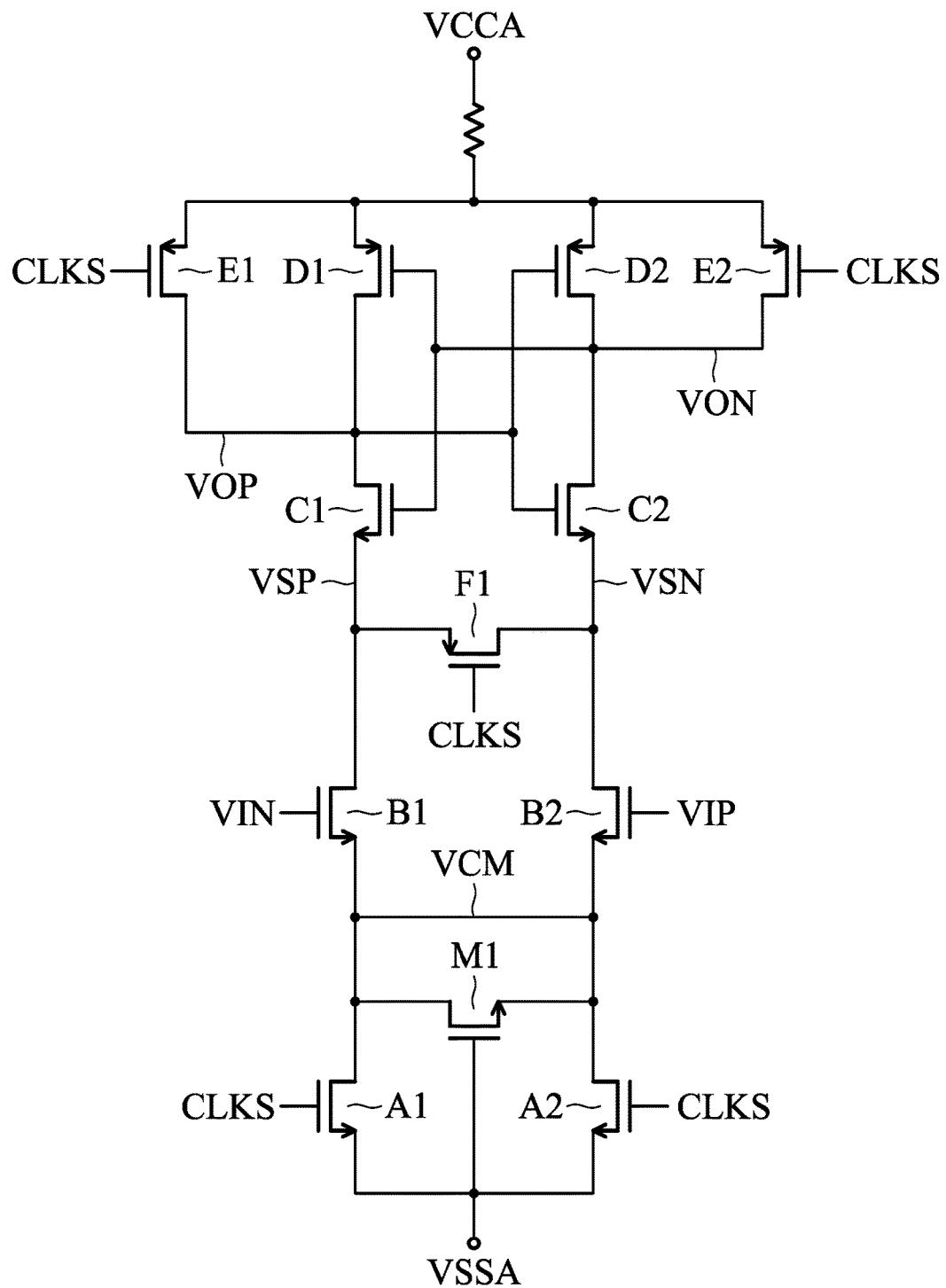
FIG. 7 shows an exemplary embodiment of a comparator.

FIG. 7 shows an exemplary embodiment of a comparator. In one embodiment, at least one of the comparators 31 and 32 in FIG. 3 is implemented as a comparator of FIG. 7. In the embodiment of FIG. 3, the input signal DIN is transmitted to the eye pattern generator 3 in the form of a differential signal. Therefore, the input signal DIN can be represented by the differential voltages VIN and VIP. In another embodiment, at least one of the comparators 31' and 32' in FIG. 6 is implemented as the comparator of FIG. 7. Referring to FIG. 7, the comparator includes P-type metal-oxide-semiconductor (PMOS) transistors D1, D2, E1, E2 and F1 and N-type metal-oxide-semiconductor (NMOS) transistors A1, A2, B1, B2, C1, C2, and M1. The source of the PMOS transistor E1 is coupled to a voltage source VCCA, the gate thereof receives the clock signal CLKS, and the drain thereof is coupled to a signal line VOP. The source of the PMOS transistor D1 is coupled to the voltage source VCCA, the gate thereof is coupled to a signal line VON, and the drain thereof is coupled to the signal line VOP. The source of the PMOS transistor E2 is coupled to the voltage source VCCA, the gate thereof receives the clock signal CLKS, and the drain thereof is coupled to the signal line VON. The source of the PMOS transistor D2 is coupled to the voltage source VCCA, the gate thereof is coupled to the signal line VOP, and the drain thereof is coupled to the signal line VON. The drain of the NMOS transistor C1 is coupled to the signal line VOP, the gate thereof is coupled to the signal line VON, and the source thereof is coupled to a signal line VSP. The drain of the NMOS transistor C2 is coupled to the signal line VON, the gate thereof is coupled to the signal line VOP, and the source thereof is coupled to a signal line VSN. The drain of the PMOS transistor F1 is coupled to the signal line VSN, the gate thereof receives the clock signal CLKS, and the source thereof is coupled to the signal line VSP. The drain of the NMOS transistor B1 is coupled to the signal line VSP, the gate thereof receives the differential voltage VIN, and the source thereof is coupled to a signal line VCM. The drain of the NMOS transistor B2 is coupled to the signal line VSN, the gate thereof receives the differential voltage VIP, and the source thereof is coupled to the signal line VCM. The drain and the source of the NMOS transistor M1 are coupled to the signal line VCM, and the gate thereof is coupled to a voltage source VSSA. The drain of the NMOS transistor A1 is coupled to the signal line VCM, the gate thereof the NMOS transistor A1 receives the clock signal CLKS, and the source thereof is coupled to the voltage source VSSA. The drain of the NMOS transistor A2 is coupled to the signal line VCM, the gate thereof receives the clock signal CLKS, and the source thereof is coupled to the voltage source VSSA.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An eye pattern generator for generating an eye pattern of an input signal, comprising:
    a first comparator receiving the input signal, a first clock signal, and a first voltage and comparing the input signal with the first voltage according to the first clock signal to generate a first comparison signal;
    a second comparator receiving the input signal, the first clock signal, and a second voltage that is lower than the first voltage, and comparing the input signal with the second voltage according to the first clock signal to generate a second comparison signal; and
    a control circuit receiving the first comparison signal and the second comparison signal and changing at least one of a level of the first voltage and a level of the second voltage according to the first comparison signal and the second comparison signal to form a region boundary between an open-eye region and a closed-eye region of the eye pattern.

2. The eye pattern generator as claimed in claim 1, further comprising a regulator, wherein the regulator changes a plurality of sampling edges of the first clock signal, the plurality of sampling edges of the first clock signal being changed correspond to a plurality of points on a time axis of the eye pattern.

3. The eye pattern generator as claimed in claim 1, wherein the control circuit performs a determination operation to determine whether an accumulated number of a plurality of sampled values is greater than a threshold within a fixed time period, each of the plurality of sampled values is less than the first voltage and greater than the second voltage, and the threshold is a natural number.

4. The eye pattern generator as claimed in claim 3, wherein when the accumulated number of the plurality of sampled values is greater than the threshold within the fixed time period, the control circuit decreases the first voltage or increases the second voltage, and resets the accumulated number.

5. The eye pattern generator as claimed in claim 3, wherein when the accumulated number of the plurality of sampled values is not greater than the threshold within the fixed time period, the control circuit increases the first voltage or decreases the second voltage, and resets the accumulated number at the end of the fixed time period.

6. The eye pattern generator as claimed in claim 3, wherein when two results of the determination operation performed by the control circuit of two detection periods are different, the first voltage used in one of the two detection periods is compared with the first voltage used in the other of the two detection periods, and the first voltage with a lower level is taken as a first boundary voltage; and wherein the second voltage used in one of the two detection periods is compared with the second voltage used in the other of the two detection periods, and the second voltage with a higher level is taken as a second boundary voltage.

7. The eye pattern generator as claimed in claim 2, wherein the control circuit comprises:
- an exclusive OR gate receiving the first comparison signal and the second comparison signal, and generating a logic output signal according to the first comparison signal and the second comparison signal;
- a counting circuit receiving the logic output signal, and generating an accumulated number of the logic output signal being a high level;
- a determination circuit comprising a timer, wherein the determination circuit receives the accumulated number and performs a determination operation to determine whether the accumulated number is greater than a threshold within a fixed time period to generate a determination signal, the threshold is a natural number; and
- a voltage generation circuit generating the first voltage and the second voltage, and changing at least one of the first voltage and the second voltage according to the determination signal.

8. The eye pattern generator as claimed in claim 7, wherein when the accumulated number is greater than the threshold value within the fixed time period, the voltage generation circuit decreases the first voltage or increases the second voltage, and the accumulated number is reset.

9. The eye pattern generator as claimed in claim 7, wherein when the accumulated number is not greater than the threshold within the fixed time period, the voltage generation circuit increases the first voltage or decreases the second voltage at the end of the fixed time period, and the accumulated number is reset.

10. The eye pattern generator as claimed in claim 7, wherein when results of the determination operation performed by the control circuit of two detection periods are different, the first voltage used in one of the two detection periods is compared with the first voltage used in the other of the two detection periods, the first voltage with a lower level is taken as a first boundary voltage; and wherein the second voltage used in one of the two detection periods is compared with the second voltage used in the other of the two detection periods, the second voltage with a higher level is taken as a second boundary voltage.

11. The eye pattern generator as claimed in claim 10, wherein the eye pattern generator continuously obtains the first boundary voltage and the second boundary voltage, to form the region boundary with the plurality of points on the time axis of the eye pattern.

* * * * *